United States Patent Office 3,791,986

Patented Feb. 12, 1974

3,791,986
PRECONDITIONER CONCENTRATE

Charles D. Mallico, Stratford, Conn., assignor to Enthone, Incorporated, New Haven County, Conn.

No Drawing. Filed Oct. 28, 1971, Ser. No. 193,589
Int. Cl. B01f *17/32*
U.S. Cl. 252—355 7 Claims

ABSTRACT OF THE DISCLOSURE

Surfaces of electrical insulating synthetic resin material, especially reinforced epoxy surfaces, are preconditioned without severely attacking, roughening and/or distorting the surfaces by contacting the surfaces with an acidic solution containing a five-membered nitrogen heterocyclic compound, for example 2-pyrrolidone, until the surfaces are rendered conditionable by a strong acid aqueous oxidizing conditioning solution. The resulting conditionable surfaces are then conditioned by contact with the strong acid aqueous oxidizing solution, followed by electroless metal plating of the surfaces to obtain a smooth chemical reduction metal deposit thereon which is of acceptable appearance and firmly adherent to the surfaces. The invention is especially useful in the preparation of additive-type printed circuit boards.

BACKGROUND OF THE INVENTION

(1) Field of the invention

This invention relates to preconditioning surfaces of electrical-insulating synthetic resin material, and more especially to preconditioner compositions and to processes for preconditioning and conditioning the insulating synthetic resin surfaces, especially reinforced epoxy resin surfaces, and especially in preparation for electroless metal plating of the surfaces.

(2) Description of the prior art

Prior to the use of organic and inorganic solvents as surface conditioning solutions, strong adhesion of electroless copper film deposits to insulating reinforced epoxy resin boards such as epoxy-glass boards was not attainable. This necessitated the copper cladding of the resin board with about 0.7 to 2.8 mils of copper. However fine lines in the circuit pattern and narrow spacing of circuits is not easily attained with this method. Further an appreciable amount of copper is etched away and wasted with use of the copper clad boards, and undercutting of the circuit also tends to occur.

Prior attempts to render the reinforced epoxy material, such as epoxy-glass boards, plateable with electroless, i.e. chemical reduction, copper with adequate adhesion resulted in severe attack of the reinforced epoxy surface. Such unsatisfactory prior attempts included the treatment of the reinforced epoxy surfaces with chlorinated and fluorinated solvents such as methylene chloride and hydrofluoric acid. Dimethyl fluoride and dimethyl sulfoxide were also utilized and observed to severely attack the epoxy surface resulting in exposing the glass fibers. This attack of the reinforced epoxy surface produces a rough surface appearance on the finished board. This roughness is undesirable both from the standpoint of appearance and detrimentally affecting the solderability of the surface. The exposure of glass fibers can also seriously adversely affect the electrical properties of the finished printed circuit boards.

BRIEF SUMMARY OF THE INVENTION

In accordance with the present invention, I have found that surfaces of articles or objects of an electrical insulating synthetic resin material are preconditioned with good results to render the surfaces conditionable by subsequent contact with a strong acid aqueous oxidizing conditioning solution, by contacting the article surface with, usually by immersing the surface in, an acidic solution containing a five-membered saturated nitrogen heterocyclic compound. The preconditioned surface or surfaces can then be conditioned by being contacted with, usually by immersing the surface or surfaces in, a strong acid aqueous oxidizing solution until the surface is rendered capable of firm adherence to a chemical reduction metal plate or deposit. The present invention constitutes a considerable improvement over the prior art for the reasons: (1) enables the reinforced epoxy surfaces to be rendered suitable for electroless metal plating without severely attacking, distorting or severely roughening the surfaces; (2) very smooth, firmly adherent electroless copper deposits are obtained on the reinforced epoxy surfaces with a Pull Test in excess of 5 lbs. per linear inch; (3) enables the production of printed circuit boards by an additive-type process involving the chemical reduction copper plating of appreciably thinner copper deposits or films on the insulating synthetic resin surfaces, as contrasted with prior "subtractive-type" processes wherein the relatively thick copper foil of the clad or insulating boards was etched away to form the circuit pattern with a considerable greater loss of copper; (4) enables more economical production of printed circuit boards by reason of etchant loss of considerably less copper; (5) enables production of printed circuit boards with less undercutting of the circuit during etching of the copper; and (6) appreciably less of a pollution problem due to less toxic copper being present in the liquid waste effluents in the preparation of printed circuit boards by the "additive-type" process. By use of the preconditioner solutions of the invention, very smooth electroless copper deposits having an average Pull Test of 8–12 lbs. per linear inch were obtained.

The five-membered nitrogen heterocyclic compound of the preconditioner solution of this invention is usually one or more compounds of the formulae:

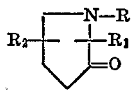

wherein R is hydrogen atom or a methyl group, $R_1$ is a hydrogen atom or a methyl group, and $R_2$ is a hydrogen atom or a methyl group; and

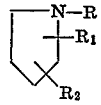

wherein R is a hydrogen atom or a methyl group, $R_1$ is a hydrogen atom or a methyl group, and $R_2$ is a hydrogen atom or a methyl group. Exemplary of the nitrogen compounds, which have 4 carbon atoms and one nitrogen atom in the heterocyclic nucleus, are 2-pyrrolidone, 1,5-dimethyl-2-pyrrolidone, 3,3-dimethyl-2-pyrrolidone, 1-methyl-2-pyrrolidone, pyrrolidine, 1,2-dimethyl pyrrolidine and 2,5-dimethyl pyrrolidine.

The acidic pre-conditioning solution herein ordinarily contains an organic acid of the formula $$RCOOM$$

wherein R is a hydrogen atom or a 1–6 C alkyl group and M is a hydrogen atom or an alkali metal cation, e.g. $Na^+$ or $K^+$, in adidtion to the five-membered nitrogen heterocyclic compound. Exemplary of the organic acids and salts are formic, propionic, n-butyric and n-valeric acids and their sodium or potassium salts.

The preconditioner solutions of this invention are either utilized as such, i.e. as concentrate solutions, for preconditioning the surfaces to be conditioned or these concentrate solutions are mixed together with an aqueous liquid, usually water, to form less concentrated preconditioned solutions prior to use in pre-conditioning the surface to be conditioned. The concentrate solutions are mixed together with the aqueous liquid such as water in typical volume ratios of from 1:1 to 1:5 respectively prior to use.

The proportions of the constituents of the less concentrated preconditioner solutions and the concentrate preconditioner solutions herein are not especially critical, and can be varied over broad ranges. Generally speaking a lesser amount of the organic acid is utilized in all solutions herein than the five-membered saturated nitrogen heterocyclic compound. The wetting agent is used in a minor amount, sufficient to impart wettability, i.e. the capability of spreading on the synthetic resin material surface or surfaces being preconditioned and wetting such surfaces, to the preconditioner solutions.

The preconditioner solutions of this invention are utilizable at room temperature or at elevated temperature of the solution for preconditioning the synthetic resin surfaces, for instance the reinforced epoxy resin surfaces. Thus solution temperatures of room temperature to about 120° F. and even higher are utilizable for preconditioning the resin surfaces.

The time of preconditioning the resin surfaces, for instance the reinforced epoxy surfaces, is that sufficient to render the surface or surfaces conditionable, i.e. capable of being conditioned, by a strong acid aqueous oxidizing conditioning solution. The preconditioning time will vary with the temperature of the preconditioner solution with higher solution temperatures requiring shorter preconditioning times than is the case with lower solution temperatures. Thus with the temperature of the preconditioner solution at 120° F. for preconditioning a hard, glossy finished glass-reinforced epoxy resin, a pre-conditioning time of 2 minutes was effective. However with a preconditioning solution temperature of 70° F. for preconditioning the surface of a thin epoxy resin layer over the surface of the glass-reinforced epoxy resin, a preconditioning time of 3–5 minutes was effective.

The synthetic resin of the dielectric boards or supports of the printed circuits preparable by use of this invention is exemplified by fiber glass-reinforced or filled epoxy resins, also referred to as epoxy-glass resins, paper-reinforced or filled epoxy resins, and paper-reinforced or filled phenolic resins, e.g. phenol-formaldehyde resins. In the preparation of the epoxy-glass resins, the glass is usually combined with the epoxide resin in the form of woven fiber glass cloth to form epoxide-glass cloth laminates.

Prior to preconditioning the synthetic resin or polymer surface or surfaces such as, for example the reinforced resin surfaces, e.g. the epoxy-glass surfaces, in accordance with this invention, the resin surfaces if not already clean are cleaned, for instance by immersion in an alkaline cleaner such as a non-silicated alkaline cleaner. Exemplary of such alkaline cleaners is the aqueous cleaner solution set forth hereafter:

| | G./l. |
|---|---|
| NaOH | 60 |
| $Na_3PO_4 \cdot 12H_2O$ | 10 |

After the preconditioning, the reinforced resin surfaces are conditioned by contact with, usually by immersion in, a strong acid aqueous oxidizing conditioner solution, at room temperature or elevated temperature for a time sufficient to condition the resin surfaces. Any suitable strong acid aqueous oxidizing solution can be used for this conditioning of the resin surfaces. Exemplary of such conditioner solution is the following aqueous solution

| | | |
|---|---|---|
| $CrO_3$ | oz./gallon | 10 |
| $H_2SO_4$ | fl. oz./gallon | 32 |

Another example of the strong acid aqueous oxidizing solution for the conditioning is:

| | | |
|---|---|---|
| $K_2Cr_2O_7$ | g | 15 |
| $H_2SO_4$ | ml | 100 |
| $H_2O$ | ml | 50 |

The conditioned reinforced resin surfaces are then sensitized by being contacted with, usually by immersing in, a sensitizer solution which is an acid solution of a readily oxidizable metal salt. Exemplary of the readily oxidizable metal salts are stannous salts and di- and tri-valent titanium salts of inorganic acids, preferably of strong inorganic or mineral acids, for example such salts of the monobasic halogen acids, HX, wherein X is a halogen atom of atomic number in the range of 17–35 inclusive. Such strong hydrohalide acids, i.e. hydrochloric and hydrobromic acids, are characterized by being non-oxidizing acids. Exemplary of such stannous and titanium salts are stannous chloride, stannous bromide, titanium dichloride, titanium, trichloride, titanium dibromide and titanium tribromide. The chlorides are preferred and stannous chloride is preferred among the chlorides. A typical aqueous sensitizer solution for use herein is:

| | | |
|---|---|---|
| $SnCl_2$ | g | 10 |
| HCl | ml | 40 |
| $H_2O$ | ml | 1000 |

The epoxy-glass surfaces are maintained in contact with the sensitizer solution for a period sufficient to sensitize the surfaces.

The sensitized surfaces are then activated by being contacted, with, usually by being immersed in, an activator solution which is an acid solution of a readily reducible metal salt wherein the metal is catalytic to the chemical reduction metal plating deposition. The activator solution is usually an acidic aqueous solution of a noble metal salt. The noble metal salt is exemplified by a salt of a platinum group metal, e.g. Pt, Pd, Rh, Ru; gold or silver, for example the chloride of such metals. Palladium chloride is the noble metal salt usually used in the activator solution. A typical activator solution for use herein is the following:

| | | |
|---|---|---|
| $PdCl_2$ | g | 1 |
| HCl | ml | 10 |
| $H_2O$ | gallon | 1 |

The reinforced resin, e.g. the epoxy-glass surfaces, are maintained in contact with the activator solution for a period sufficient to activate the surfaces.

The activated epoxy-glass surfaces are then electrolessly copper plated by contact with, usually by immersing in, a chemical reduction copper plating solution for a time sufficient to deposit a copper plate of the desired thickness thereon. A suitable chemical reduction copper plating solution is the following aqueous solution:

| | G./l. |
|---|---|
| Copper sulfate | 29 |
| Sodium carbonate | 25 |
| Rochelle salt | 140 |
| "Versene T" | 17 |
| Sodium hydroxide | 40 |
| Formaldehyde (37% solution) | 166 |

pH, 11.5.
Temperature, 70° F.

"Versene T" is a soluble salt of ethylenediamine tetraacetic acid readily obtainable in commerce. The epoxy-glass surfaces are maintained in contact with the plating solution for a time sufficient to deposit thereon a copper plate or layer of the desired thickness.

Alternatively, the sensitizing and activating steps previously disclosely herein can be combined into a single activating step by use of the activator composition disclosed in U.S. Pat. 3,011,920.

Although the activated epoxy-glass surfaces will ordinarily be electrolessly plated with copper when additive-type printed circuit boards are prepared, alternatively the activated epoxy-glass surfaces may be electrolessly plated with other metals, for example, nickel or cobalt, when the plated epoxy-glass substrate is to be used for purposes other than in printed circuit boards. The activated epoxy-glass surfaces are similarly electrolessly nickel or cobalt plated by contacting the surfaces with, usually by immersing the surfaces in, a chemical reduction nickel or cobalt plating solution for a time sufficient to deposit thereon a nickel or cobalt plate of the desired thickness. Suitable chemical reduction nickel and cobalt aqueous plating solutions are set forth hereafter:

| | G./l. |
|---|---|
| Nickel chloride | 30 |
| Sodium citrate | 100 |
| Ammonium chloride | 50 |
| Sodium hypophosphite | 10 |

pH, 8–10.
Temperature, 190° F.

The pH of such chemical reduction nickel plating solution is maintained within the 8–10 range by addition of $NH_4OH$.

| | G./l. |
|---|---|
| Cobalt chloride | 30 |
| Sodium citrate | 35 |
| Ammonium chloride | 50 |
| Sodium hypophosphite | 20 |

pH, 9–10.
Temperature, 195°–205° F.

The pH of such cobalt plating solution is maintained within the 9–10 range by addition of $NH_4OH$.

In the preparation of the additive-type printed circuit boards in accordance with this invention, the epoxy-glass surfaces which have been electrolessly copper plated as previously disclosed herein are then usually given an electrolytic copper flash plating to a minimum total i.e. (electroless+flash plate) thickness of 0.1 mil copper. The flash copper plating may be carried out in an aqueous bath of the composition:

| | Oz./gal. |
|---|---|
| Copper sulfate | 26–30 |
| Sulfuric acid | 6–8 |

An organic or inorganic addition agent or agents is also usually present in the flash copper plating bath as is well known in the art. The conductive pattern desired is then formed on the thus-plated epoxy-glass substrate or board in any suitable manner. Thus the predetermined electrically conductive pattern can be formed on the copper-plated epoxy-glass substrate by applying to the copper plated substrate an etchant resist material by screen printing, and then etching away the copper not covered by the resist material by immersing the substrate or board in a suitable copper etchant solution. The resist is thereafter removed leaving the conductive pattern. Exemplary of another procedure for forming the desired conductive pattern is a photo resist process involving applying a conventional photo-sensitive emulsion of commerce to both sides of the electrolessly copper-plated reinforced epoxy support or board. A positive photo-film of the conductive pattern is disposed over the emulsion and exposed to light. The exposed emulsion is then developed which results in dissolving of the unexposed emulsion, which corresponds to the conductive pattern and holes (the holes having previously been drilled in the electrolessly copper-plated support or board), leaving the light-hardened emulsion as a plating resist. The exposed conductive pattern or circuit pattern and holes are then electroplated with copper to a thickness of usually about 1 mil. A second dissimilar metal, such as solder plate, is then electroplated over the copper circuit and holes, the photo resist then removed, following by etching away the unwanted copper with the solder plate acting as an acid resist to protect the conductive pattern and holes. These methods for forming the conductive pattern are well known in the art.

The present invention is utilizable for use in forming various types of printed circuit boards including for example "plated-through" hole printed circuit boards, multilayer printed circuits, additive circuitry and flexible circuits. Other uses for this invention are for the treatment of epoxy-coated substrates such as epoxy-coated steel and aluminum in the preparation of foundry patterns; and for improving the adhesion of films of ink and paint to the resin surfaces.

The following examples further illustrate the invention without being restrictive thereof:

EXAMPLE 1

The following constituents were mixed together in the proportions set forth to form a preconditioner concentrate solution:

| | Percent by weight |
|---|---|
| 2-pyrrolidone | 71.51 |
| Formic acid | 26.93 |
| Dodecylbenzene sulfonic acid | 1.56 |

Immersion of epoxy-glass boards in such pre-conditioner solution for 1–5 minutes at a solution temperature of room temperature-120° F., followed by conditioning the preconditioned surfaces of the boards in a strong acid aqueous oxidizing solution, sensitizing, activating and electrolessly copper plating the boards with rinsing of the boards between steps resulted in a very smooth firmly adherent copper deposit on the boards. The copper adhered to the boards with an average Pull Test of 8–12 lbs./linear inch on ½ inch width strips.

EXAMPLE 2

The preconditioner concentrate solution of Example 1 was diluted with water in the volume ratio of 1:1. Immersion of epoxy-glass boards in the resulting preconditioner solution for 1–5 minutes at a solution temperature of room temperature-120° F., followed by conditioning the preconditioned surfaces of the boards in a strong acid aqueous oxidizing solution, sensitizing, activating and electrolessly copper plating the thus-conditioned boards with rinsing of the boards between steps also resulted in a very smooth, firmly adherent copper deposit on the boards. The copper adhered to the boards with an average Pull Test of 6–12 lbs./linear inch on ½ inch width strips.

EXAMPLE 3

Epoxy-glass boards were immersed in a bath of methyl ethyl ketone for 3–5 minutes with the bath at room temperature. The methyl ethyl ketone is a swelling agent known in the prior art for swelling epoxy. The boards were then conditioned in a strong acid aqueous oxidizing solution, followed by sensitizing, activating and electrolessly copper plating the boards. The conditioning, sensitizing, activating and electroless copper plating steps were carried out under about the same conditions as in Example 1 herein. The boards were rinsed between steps.

The plated boards exhibited a rough copper deposit, and adherence of the copper to the boards was poor with an average Pull Test of 0–3 lbs. per linear inch on ½ inch width strips. Blistering occurred between the copper deposit and the epoxy-glass substrates.

EXAMPLE 4

Epoxy-glass boards were immersed in a strong acid aqueous oxidizing solution of the prior art, without prior preconditioning of boards, for 30 seconds-2 minutes at a solution temperature of 110° F.–120° F. The boards were then sensitized, activated and electrolessly copper plated under about the same conditions as in Example 1 herein.

The boards were rinsed between steps. Incomplete coverage of the boards with electroless copper resulted and blistering of the electroless copper deposit also occurred. The electroless copper deposit showed poor adherence to the boards with a Pull Test of only 0–½ lb. per linear inch on ½ inch width strips.

EXAMPLE 5

Epoxy-glass boards were immersed for 5 minutes in the preconditioner solution of Example 2 obtained by diluting the preconditioner concentrate solution referred to in Example 2 with water in the volume ratio of 1:1. The preconditioner solution was at a temperature from room temperature to 100° F. The strong acid aqueous oxidizing conditioning step was omitted, and the thus preconditioned boards were sensitized, activated, and electrolessly copper plated under about the same conditions as in Example 1 herein. The boards were rinsed after each step. Skip-plating and blistering was observed in the electroless copper deposit on the boards. Adhesion of the copper to the boards was poor or non-existent with an average Pull Test of 0 lb. per square inch on ½ inch width strips.

The considerable improvement provided by the preconditioner of this invention is shown by Examples 1 and 2 involving the use of the preconditioner of this invention followed by conditioning with a strong acid aqueous oxidizing solution also in accordance with this invention, and wherein smooth, firmly adherent copper deposits were obtained on the epoxy-glass boards. This is in contrast with Examples 3 and 4 not utilizing the preconditioner of this invention and with Example 5 omitting the conditioning with the strong acid aqueous oxidizing solution of the process of this invention wherein unsatisfactory weakly or non-adherent copper deposits were obtained on the boards and which were either rough deposits or discontinuous copper deposits due to skip-plating.

The following examples of preconditioner solutions also further illustrate the invention without being unduly restrictive.

EXAMPLE 6

| | Percent by weight |
|---|---|
| 1-methyl-2-pyrrolidone | 71.5 |
| Formic acid | 27.0 |
| Dodecylbenzene sulfonic acid | 1.5 |

A smooth firmly adherent electroless copper deposit on the epoxy-glass boards was obtained when the epoxy-glass boards were preconditioned with the above solution followed by conditioning the boards in a strong acid aqueous oxidizing solution, sensitizing, activating and electrolessly copper plating the thus-conditioned boards. The boards were rinsed between steps.

EXAMPLE 7

| | Percent by weight |
|---|---|
| 1,5-dimethyl-2-pyrrolidone | 71.51 |
| Acetic acid | 26.93 |
| Dodecylbenzene sulfonic acid | 1.56 |

Smooth firmly adherent copper deposits with an average Pull Test of 6–10 lbs./linear inch on ½ inch width strips are obtained when epoxy-glass boards are preconditioned with the above solution, followed by conditioning in a strong acid aqueous oxidizing solution, sensitizing, activating, and electrolessly copper plating the boards. The boards were rinsed between steps.

EXAMPLE 8

| | Percent by weight |
|---|---|
| 3,3-dimethyl-2-pyrrolidone | 75.0 |
| n-Valeric acid | 23.25 |
| Sodium lauroyl sarcosinate | 1.75 |

Smooth firmly adherent copper deposits with an average Pull Test of 6–10 lbs./linear inch on ½ inch width strips are obtained when the epoxy-glass boards are preconditioned with the above solution followed by conditioning in a strong acid aqueous oxidizing solution, sensitizing, activating, and electrolessly copper plating the boards. Rinsing of the boards was effected between steps.

EXAMPLE 9

| | Percent by weight |
|---|---|
| 1-methyl-2-pyrrolidone | 72.50 |
| n-Butyric acid | 25.65 |
| Nonyl phenoxy polyoxyethylene ethanol | 1.85 |

Smooth firmly adherent copper deposits with an average Pull Test of 4–6 lbs./linear inch on ½ inch width strips were obtained when the epoxy-glass boards were preconditioned with the above solution followed by conditioning in a strong acid aqueous oxidizing solution, sensitizing, activating and electrolessly copper plating the boards. The boards were rinsed between steps.

EXAMPLE 10

| | Percent by weight |
|---|---|
| Pyrrolidine | 68.5 |
| $H_2O$ | 30.0 |
| Dodecylbenzene sulfonic acid | 1.5 |

Smooth firmly adherent copper deposits with an average Pull Test of 4–6 lbs./linear inch on ½ inch width strips were obtained when the epoxy-glass boards were preconditioned with the above solution, followed by conditioning in a strong acid aqueous oxidizing solution, sensitizing, activating and electrolessly copper plating the boards. Rinsing of the boards was effected between steps.

DESCRIPTION OF THE PREFERRED EMBODIMENTS

The preconditioning solutions of this invention preferably contain a wetting agent in addition to the five-membered nitrogen heterocyclic compound and the acid. The reason for this is that omission of the wetting agent from the solution, although yielding operable preconditioners, results in appreciably lower strength adherence of the electroless copper to the dielectric resin substrate. Any suitable wetting agent is utilizable with anionic surfactant wetting agents being preferred. Exemplary of the anionic wetting agents are dodecylbenzene sulfonic acid or its alkali metal, e.g. sodium or potassium, salts, sodium lauroyl sarcosinate, and sodium alkyl aryl sulfonate. The dodecylbenzene-sulfonic acid or its alkali metal salt is preferred among the anionic wetting agents. Fluorocarbon wetting agents are also utilizable. Non-ionic wetting agents, e.g. nonyl phenoxy polyoxyethylene ethanol and polyetheneoxy ether, are also utilizable but are not preferred. Cationic surfactant wetting agents are also utilizable.

2-pyrrolidone is the preferred nitrogen heterocyclic compound. Formic acid is preferred among the organic acids.

Preferably the preconditioner solutions herein contain, by weight, about 60–85% of the 5-membered saturated nitrogen heterocyclic compound and about 8–35% of the acid.

The following cycle is recommended for copper plating epoxy-glass boards in the manufacture of printed circuit boards:

(1) Immerse epoxy-glass boards in pre-conditioner solution of this invention containing, by weight, 71.51% 2-pyrrolidone, 26.93% formic acid and 1.56% dodecylbenzene sulfonic acid at a solution temperature of room temperature-120° F. for 1–5 minutes. After withdrawal of the boards from the solution, drain the boards over the solution for 30 seconds to 1 minute.

(2) Immerse boards in anhydrous isopropyl alcohol at 65° F.–75° F. for 1 minute. After withdrawal of the boards, drain the boards over the alcohol for 30 seconds.

(3) Repeat the procedure of 2 immediately supra with substantially identical conditions as in 2.

(4) Air dry the boards for 3–8 minutes or until dry.

(5) Immerse boards in a strong acid aqueous oxidizing conditioner solution containing sulfuric acid and chromic acid, at a solution temperature of 120° F. for from 30 seconds to 1 minute.

(6) Water rinse the boards.

(7) Water rinse the boards.

(8) (Optional step). Hot water rinse the boards at a water temperature of from 140° F.–160° F. for from 1 to 2 minutes.

(9) Immerse the boards in an aqueous hydrochloric acid solution containing 30% by volume hydrochloric acid at a solution temperature of 65° F.–75° F. for 1 minute.

(10) Water rinse the boards.

(11) Immerse the boards in an aqueous sensitizer solution containing hydrochloric acid and stannous chloride at a solution temperature of 65° F.–75° F. for 1 minute.

(12) Water rinse the boards.

(13) Water rinse the boards.

(14) Immerse the boards in an aqueous activator solution containing palladium chloride and hydrochloric acid at a solution temperature of 65° F.–75° F. for 1 minute.

(15) Water rinse the boards.

(16) Water rinse the boards at a temperature of the water of 60° F. or higher.

(17) (Optional step). Dry the boards and bake boards 15–30 minutes at 250°–300° F.

(18) Immerse the boards in a chemical reduction copper plating bath at a bath temperature of 70° F.–75° F. for 10–15 minutes.

(19) Water rinse the boards.

(20) Immerse the boards in aqueous sulfuric acid solution containing 10%–15% by volume of sulfuric acid (Analytic Reageant grade), at a solution temperature of 65° F.–75° F. for ½–1 minute.

(21) Water rinse the boards.

(22) Electrolytically copper flash plate the boards to a minimum copper thickness of 0.1 ml.

The desired conductive pattern or circuit design is then provided on the boards in conventional manner, for example by silk screening. After the unwanted copper is etched away leaving only the desired circuit pattern, the boards are water rinsed, dried and baked at 180°–250° F. for one hour.

Another cycle recommended for copper plating epoxy-glass boards in the manufacture of printed circuit boards is set forth hereafter. This cycle enables the dielectric reinforced resin substrate or board to be selectively plated with metal to the desired conductive pattern or design without the need for metal plating the entire board, and without the requirement of etching away undesired copper.

Steps 1 through 10 inclusive—same as steps 1 through 10 inclusive of the recommended cycle for copper plating epoxy-glass boards set forth immediately supra.

(11) Apply a photoresist to the entire surface of the boards.

(12) Expose the photoresist-coated boards to ultaviolet light only on those portions of the coated boards where the conductive pattern is not wanted. The thus-exposed boards are then developed chemically by immersion in trichloroethane, to remove the unexposed photoresist coating from the areas of the boards where the conductive pattern is desired and hence metal plating is desired.

(13) Rinse the boards in a proprietary alkaline rinse solution identified as PC 452 rinse solution and obtainable from Enthone, Inc., Frontage Road, West Haven, Conn. for 1–3 minutes at 150° F.

(14) Water rinse the boards.

(15) Immerse the boards in an aqueous sensitizer solution containing hydrochloric acid and stannous chloride at a solution temperature of 65° F.–75° F. for 1 minute.

(16) Water rinse the boards.

(17) Water rinse the boards.

(18) Immerse the boards in an aqueous activator solution containing palladium chloride and hydrochloric acid at a solution temperature of 65° F.–75° F. for 1 minute.

(19) Water rinse the boards.

(20) Water rinse the boards at a water temperature of 60° F. or higher.

(21) Immerse the boards in a photoresist stripper solution readily obtainable in commerce for 2–5 minutes and at room temperature of the solution, to remove the ultraviolet light-exposed photoresist from those areas of the boards where the conductive pattern is not wanted.

(22) Water rinse the boards.

(23) Immerse the boards in aqueous sulfuric acid solution containing 15% by volume of sulfuric acid (Analytic Reagent grade), at a solution temperature of 65° F.–75° F. for ½–1 minute.

(24) Water rinse the boards.

(25) Immerse the boards in a chemical reduction copper plating bath at a bath temperature of 70° F.–75° F. to electrolessly plate copper on the activated areas of the boards to form the desired electrically conductive pattern thereon. The boards are retained in the chemical reduction copper plating bath until a conductive pattern of the desired thickness is obtained, after which the boards are water rinsed, dried and baked at 180°–250° F. for one hour.

A preferred preconditioner solution of this invention contains the constituents in proportions within the proportion ranges hereafter specified:

| | Percent by weight |
|---|---|
| Five-membered saturated nitrogen heterocyclic compound | About 60–85. |
| Organic acid of formula RCOOM | About 8–35. |
| Wetting agent | About 1–10. |

An especially preferred preconditioner solution herein contains the following constituents in proportions within the ranges hereafter specified:

| | Percent by weight |
|---|---|
| 2-pyrrolidone | About 60–85. |
| Formic acid | About 8–35. |
| Dodecylbenzene sulfonic acid | About 1–10. |

A more preferred preconditioner solution herein was the following solution:

| | Percent by weight |
|---|---|
| 2-pyrrolidone | 71.51 |
| Formic acid | 26.93 |
| Dodecylbenzene sulfonic acid | 1.56 |

Although the invention has been described and illustrated in detail it is to be understood that the same is by way of illustration and example only and is not taken by way of limitation, the spirit and scope of this invention being limited only by the terms of the appended claims.

What is claimed is:

1. A preconditioner solution consisting essentially of at least one five-membered saturated nitrogen heterocyclic compound of the formula

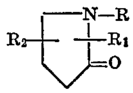

wherein R is hydrogen or methyl, $R_1$ is hydrogen or methyl and $R_2$ is hydrogen or methyl, or

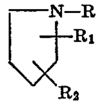

wherein R is hydrogen or methyl, $R_1$ is hydrogen or methyl and $R_2$ is hydrogen or methyl, an organic acid, and a minor amount, sufficient to impart wettability to the preconditioner solution, of a wetting agent, a lesser amount of the organic acid being present in the soltuion than the five-membered saturated nitrogen heterocyclic compound.

2. The solution of claim 1 wherein the wetting agent is a cationic surfactant wetting agent. and the organic acid is of the formula

RCOOM wherein R is hydrogen or 1–6 C alkyl and M is hydrogen or alkali metal.

3. The solution of claim 1 containing, by weight, about 60–85% of the nitrogen heterocyclic compound and about 8–35% of the organic acid.

4. The solution of claim 3 also containing about 1–10%, by weight, of the wetting agent.

5. The solution of claim 4 wherein the nitrogen heterocyclic compound is 2-pyrrolidone and the organic acid is formic acid.

6. The solution of claim 5 wherein the wetting agent is dodecylbenzene sulfonic acid.

7. A preconditioner concentrate adapted to be mixed together with an aqueous liquid to form a preconditioner solution consisting essentially of at least one five-membered saturated nitrogen heterocyclic compound of the formula

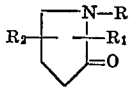

wherein R is hydrogen or methyl, $R_1$ is hydrogen or methyl, and $R_2$ is hydrogen or methyl, or

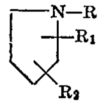

wherein R is hydrogen or methyl, $R_1$ is hydrogen or methyl and $R_2$ is hydrogen or methyl, an organic acid, and a minor amount, sufficient to impart wettability to the ultimate pre-conditioner solution, of a wetting agent, a lesser amount of the organic acid being present in the concentrate than the five-membered saturated nitrogen heterocyclic compound.

References Cited

UNITED STATES PATENTS

| | | | |
|---|---|---|---|
| 2,826,596 | 3/1958 | Maher | 252—356 |
| 3,344,083 | 9/1967 | Dickson et al. | 252—355 |
| 3,445,350 | 5/1969 | Klinger et al. | 117—47 A |
| 3,563,784 | 2/1971 | Innes et al. | 117—47 A |
| 3,655,645 | 4/1972 | Jacques | 252—356 |
| 3,567,489 | 3/1971 | Rathsack | 117—47 A |
| 3,679,611 | 7/1972 | Gerecht | 252—542 |

WILLIAM D. MARTIN, Primary Examiner

J. A. BELL, Assistant Examiner

U.S. Cl. X.R.

117—47 A; 204—30 R; 252—356, 357, 542; 260—313.1, 326.5